United States Patent [19]
Adler

[11] Patent Number: 4,593,458
[45] Date of Patent: Jun. 10, 1986

[54] FABRICATION OF INTEGRATED CIRCUIT WITH COMPLEMENTARY, DIELECTRICALLY-ISOLATED, HIGH VOLTAGE SEMICONDUCTOR DEVICES

[75] Inventor: Michael S. Adler, Schenectady, N.Y.

[73] Assignee: General Electric Company, Schenectady, N.Y.

[21] Appl. No.: 667,933

[22] Filed: Nov. 2, 1984

[51] Int. Cl.[4] .................. H01L 21/76; H01L 21/306; H01L 21/441
[52] U.S. Cl. ............................ 29/576 W; 29/571; 29/576 B; 29/577 C; 148/1.5; 148/175; 148/187; 357/52
[58] Field of Search ............ 29/576 W, 577 C, 576 B, 29/571; 148/1.5, 175, 187; 357/52

[56] References Cited

U.S. PATENT DOCUMENTS

| | | | |
|---|---|---|---|
| 4,199,774 | 4/1980 | Plummer | 357/41 |
| 4,299,024 | 11/1981 | Piotrowski | 29/571 |
| 4,335,504 | 6/1982 | Lee | 148/1.5 |
| 4,364,073 | 12/1982 | Becke et al. | 357/23 |
| 4,408,386 | 10/1983 | Takayashiki et al. | 29/576 W |
| 4,412,868 | 11/1983 | Brown et al. | 29/576 B |
| 4,416,050 | 11/1983 | Sarace | 29/571 |
| 4,481,707 | 11/1984 | Cunniff | 29/580 |
| 4,494,303 | 1/1985 | Celler et al. | 29/576 W |
| 4,501,060 | 2/1985 | Frye et al. | 29/576 W |
| 4,507,158 | 3/1985 | Kamins et al. | 29/576 W |

OTHER PUBLICATIONS

Copending, Commonly-assigned application Ser No. 449,321, filed on Dec. 13, 1982.
Copending, Commonly-assigned application Ser No. 449,322, filed on Dec. 13, 1982.
Copending, Commonly-assigned application Ser. No. 464,161, filed on Feb. 4, 1983.
Copending, Commonly-assigned application Ser No. 483,009, filed on Apr. 7, 1983.
Copending, Commonly-assigned application, Ser. No. 548,530, filed on Nov. 3, 1983.
T. Suzuki et al., "Deformation in Dielectric-Isolated Substrates and Its Control by a Multilayer Polysilicon Support Structure"; J. Electrochem. Soc.: Solid State Science and Technology, vol. 127, (Jul. 1980), pp. 1537–1542.
A. C. Ipri, "The Properties of Silicon–On–Sapphire Substrates, Devices and Integrated Circuits", contained in D. Kahng, Editor, Applied Solid State Science, Supplement 2, Silicon Integrated Circuits, Part A, New York: Academic Press (1981), pp. 253–295.
C. A. Deanto, "Custom Interface IC Design for ARIN-C-429-4 Application", Proceedings of the 1981 Custom Integrated Circuits Conference, Rochester, NY (May 11–13, 1981), pp. 13–15.
G. W. Cullen et al., Editors; "Heteroepitaxial Silicon Semiconductors for Electronic Circuitry", New York: Springer-Verlag, (1978), pp. 89–94.

Primary Examiner—Upendra Roy
Attorney, Agent, or Firm—John R. Rafter; James C. Davis, Jr.; Marvin Snyder

[57] ABSTRACT

Fabrication of an integrated circuit containing complementary, dielectrically-isolated, high voltage semiconductor devices of the lateral-current conduction type involves doping of the voltage-supporting regions of the complementary devices in two steps, in accordance with Lateral Charge Control technology. A first conductivity type dopant is introduced into a semiconductor layer as it is being epitaxially grown, with the dopant concentration being below about 20 percent of the desired final doping concentration of the first conductivity type voltage-supporting region. Ion implantation of further first conductivity type dopant achieves final doping of the first conductivity type voltage-supporting region, while a separate ion implantation of a second conductivity dopant achieves final doping of the second conductivity type voltage-supporting region. For high current silicon devices having voltage-supporting regions thicker than about 5 microns, a fast-diffusing P-conductivity dopant, such as aluminum, forms the P-conductivity type voltage-supporting region for enhancing device current conduction capacity, particularly in bipolar devices, such as IGTs or bipolar transistors.

5 Claims, 7 Drawing Figures

4,593,458

FABRICATION OF INTEGRATED CIRCUIT WITH COMPLEMENTARY, DIELECTRICALLY-ISOLATED, HIGH VOLTAGE SEMICONDUCTOR DEVICES

BACKGROUND OF THE INVENTION

The present invention relates to a method of fabricating an integrated circuit including complementary high voltage semiconductor devices and, more particularly, to such method wherein the high voltage semiconductor devices are of the dielectrically-isolated type.

Various electrical circuits could benefit from the economy and simplicity of utilizing an integrated circuit that includes complementary, high voltage semiconductor devices. This is true, for example, for alternating current switches, push-pull drives, or half-bridge circuits.

The use of dielectric material to isolate the complementary semiconductor devices from each other and from a substrate of an integrated circuit is appealing, since this arrangement prevents parasitic device-to-device current and parasitic device-to-substrate current. Two types of devices which incorporate dielectric material to achieve the desired isolation are known in the art as dielectric isolation (DI) and silicon-on-insulation (SOI) devices. A key feature of these types of devices is that each includes respective insulating tubs situated on a substrate, each tub containing epitaxially-grown semiconductor material constituting the semiconductor body of one of the complementary semiconductor devices.

The fabrication of a semiconductor device requires accurate control of the dopant levels in a voltage-supporting region of the device. This is necessary to enable the device to block current at high voltage. Such accurate doping control is difficult to attain while epitaxially growing semiconductor material in the insulating tubs of DI and SOI devices. Thus, device yields (i.e., successful devices of a manufacturing batch) would expectedly be low.

It would thus be desirable to provide a method of fabricating an integrated circuit with complementary, dielectrically-isolated, semiconductor devices capable of blocking current at high voltage.

SUMMARY OF THE INVENTION

Accordingly, an object of the present invention is to provide a method of fabricating an integrated circuit, including dielectrically-isolated, complementary, high voltage semiconductor devices, wherein the required doping control for achieving high voltage is readily achievable.

It is a further object of the invention to provide a method of fabricating an integrated circuit including dielectrically-isolated, complementary, high voltage semiconductor devices, wherein enhanced currentconducting capability is attained through incorporation in the complementary devices of thick voltage-supporting regions of the lateral current-conducting type.

A still further object of the invention is to provide a method of fabricating an integrated circuit including dielectrically-isolated, complementary, high voltage semiconductor devices, wherein conventional semiconductor device fabrication techniques may be utilized.

The foregoing and other objects of the invention are realized, in preferred form, in a method of fabricating an integrated circuit with first and second, dielectrically-isolated, complementary, high voltage semiconductor devices of the type wherein the first semiconductor device includes an N-conductivity type, voltage-supporting region and the second device includes a P-conductivity type, voltage-supporting region, these voltage-supporting regions being of the lateral current-conducting type. According to the method, there is provided a semiconductor wafer including at least partially-formed first and second insulating tubs, in which the first and second semiconductor devices are to be respectively fabricated. First and second device layers of N-conductivity type silicon semiconductor material are epitaxially grown in the first and second insulating tubs, respectively, with the doping concentration of the silicon being below about 20 percent of the final dopant concentration of the N-conductivity type, voltage-supporting region.

To achieve a proper doping concentration for the P-conductivity type, voltage-supporting region, P-conductivity type dopant is then implanted into the second device layer of epitaxially grown silicon, in an amount limited to such an extent that the foregoing voltage-supporting region is entirely depletable in a current blocking mode of the second semiconductor device. For high current devices, the voltage-supporting regions are each in excess of about 5 microns in thickness, and, if desired, a fast-diffusing P-conductivity type dopant, such as aluminum, is used in the present doping step, so as to convert the entire second device layer to P-conductivity type.

To complete the doping of the N-conductivity type, voltage-supporting region, N-conductivity type dopant is implanted into the second device layer of silicon in an amount limited to such an extent that the foregoing N-conductivity type voltage-supporting region is entirely depletable in a current blocking mode of the first semiconductor device.

Main current semiconductor regions of the complementary semiconductor devices are then formed in the first and second device layers, followed by formation of respective main current electrodes on the main current semiconductor regions.

BRIEF DESCRIPTION OF THE DRAWINGS

While the specification concludes with claims defining the features of the invention that are regarded as novel, it is believed that the invention, together with further objects thereof, will be better understood from a consideration of the following description in conjunction with the drawing figures, in which:

DESCRIPTION OF THE PREFERRED EMBODIMENTS

Figure 1:
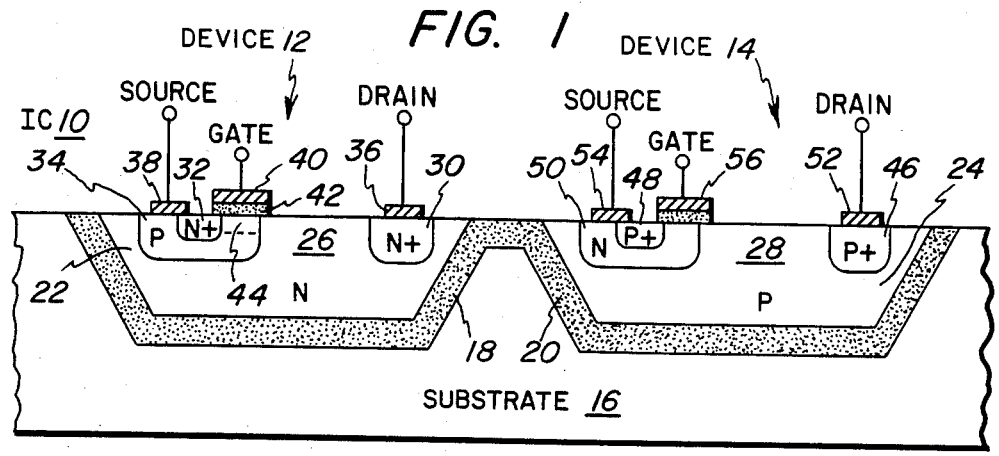
FIG. 1 is a schematic, cross-sectional view of an integrated circuit incorporating complementary semiconductor devices, in accordance with the invention.

FIG. 1 illustrates an integrated circuit (IC) 10 containing complementary semiconductor devices 12 and 14, preferably of silicon. Devices 12 and 14 are respectively situated in insulating tubs 18 and 20 of dielectric material, such as silicon dioxide. Devices 12 and 14 are, therefore, electrically isolated from a substrate 16, of polysilicon or sapphire, for example, and also from each other. Devices 12 and 14 are dielectrically-isolated devices of the type generally known as silicon-on-insulator (SOI) devices. An epitaxially-grown semiconductor layer 22 in insulating tub 18 constitutes the semiconductor body of device 12, while epitaxially-grown semiconductor layer 24 in insulating tub 20 constitutes the semiconductor body of device 14.

Device 12 includes an N-conductivity type, voltage-supporting region 26 (situated generally between device regions 30 and 34), while semiconductor device 14 includes a P-conductivity type voltage-supporting region 28 (situated generally between device regions 46 and 50). Devices 12 and 14 may comprise metal-oxide-semiconductor field-effect transistors (MOSFETs) as illustrated, although they could equally well comprise other types of semiconductor devices, such as insulated-gate transistors or bipolar transistors.

MOSFET 12 includes drain region 30, source region 32, and base region 34, these regions being formed in the upper portion of semiconductor layer 22, with source region 32 overlying base region 34. Drain 30 and source 32 regions comprise N+ (or low resistivity, N-conductivity type semiconductor material), and base region 34 comprises P (or moderate resistivity, P-conductivity type semiconductor material). A drain electrode 36 adjoins drain region 30; a source electrode 38 adjoins both source region 32 and base region 34 (as is typical in a high voltage MOSFET); and a gate electrode 40 is spaced from base region 34 by an insulating layer 42 and extends between source region 32 and voltage-supporting region 26. Gate electrode 40 is effective to induce an electron-conductive channel 44 in base region 34, immediately beneath insulating layer 42, when properly biased, channel 44 then electrically interconnecting source region 32 and voltage-supporting region 26. Normal operation of device 12 involves formation of electron-conductive channel 44 in base region 34, whereby electron current is permitted to flow from source region 32 to drain region 30, via conductive channel 44 and voltage-supporting region 26.

Complementary MOSFET 14 includes a drain region 46, a source region 48, and a base region 50, these regions being formed in the upper portion of semiconductor layer 24, with source region 48 overlying base region 50. The various semiconductor regions of MOSFET 14 are complementary in doping type to the various semiconductor regions of MOSFET 12. Drain 52, source 54, and gate 56 electrodes are included in MOSFET 12 and are similar in essential respects to drain 36, source 32, and gate 40 electrodes of device 12.

The fabrication of IC 10 commences with the provision of substrate 16 and insulating tubs 18 and 20. These portions of IC 10 may be fabricated with convention silicon-on-insulator (SOI) fabrication techniques, a suitable technique being described, for example, in T. Suzuki et al., "Deformation in Dielectric-Isolated Substrates and Its Control by a Multi-Layer Polysilicon Support Structure", *J. Electrochem. Soc.*: Solid-State Science and Technology, Vol. 127 (July 1980), pages 1537–1542, the entirety of this article being incorporated herein by reference.

Figure 2:
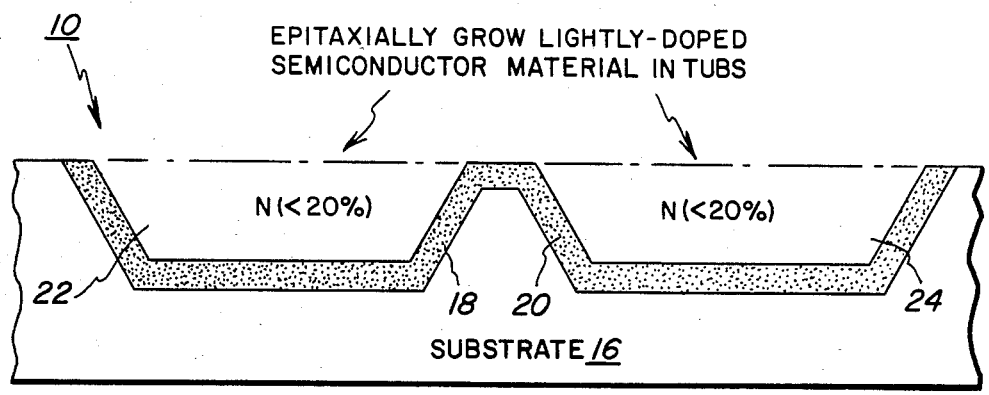
FIGS. 2–4 depict various steps of fabricating the integrated circuit of FIG. 1, in accordance with the invention.

As illustrated in FIG. 2, semiconductor layers 22 and 24 (shown in phantom), such as silicon, are epitaxially grown, preferably simultaneously, in insulating tubs 28 and 20, respectively.

Semiconductor material 22 and 24 is lightly doped to either N- or P-conductivity type (the former being illustrated). Specifically, with semiconductor layers 22 and 24 containing, for example, phosphorous dopant so as to be of N-conductivity type, the net dopant dosage level of such material, in accordance with the invention, is less than about 20 percent of the final dopant level in N-conductivity type, voltage-supporting region (FIG. 1). Where semiconductor layers 22 and 24 contain, for example, boron dopant so as to be of P-conductivity type, the net dopant dosage level of such layer is less than about 20 percent of the final, net dopant level in P-conductivity type, voltage-supporting regions 28 (FIG. 1).

The epitaxial growth of semiconductor layers 22 and 24 may follow the procedure described in the above-referenced T. Suzuki et al. article, although other suitable epitaxial growth procedures will be apparent to those skilled in the art.

Figure 3:
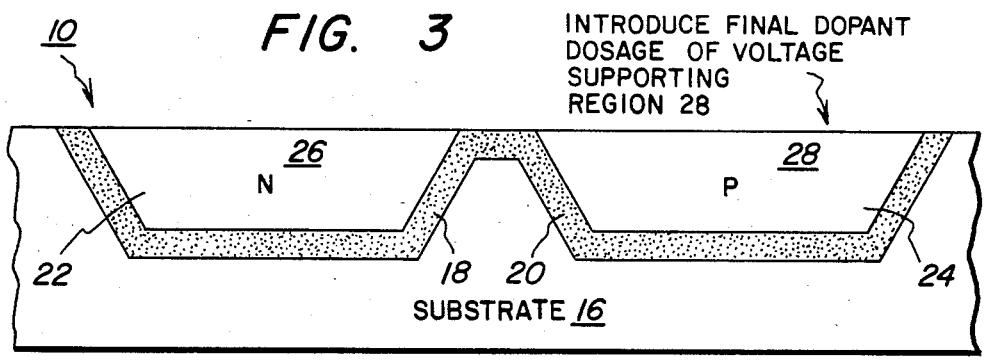

As illustrated in FIG. 3, semiconductor layer 24 is next converted to P-conductivity type, which is preferably accomplished through ion implantation of P-conductivity type dopant throughout layer 24, since this dopant introduction technique is accurately controllable in regard to net dopant dosage. The ion implant dosage is selected to achieve the final dopant level of P-conductivity type, voltage-supporting region 28. Accordingly, accurately controllable, net dopant level control is achieved for voltage-supporting region 28 because the final, accurately-controllable, net dopant dosage is much higher than the initial, less-than-20-percent of final dosage, despite the fact that it is difficult to control the initial dopant dosage during epitaxial growth of layer 24.

A suitable, final dopant level in region 28 is one in which there is sufficient fixed charge in region 28 to support voltages in a current blocking mode of device 14 (FIG. 1), but in which the amount of dopant is limited so that the entire vertical extent of region 28 is depleted of mobile charges at the rated blocking voltage of device 14. The lateral dimension of region 28 (as viewed in FIG. 1) determines the rated voltage of device 14, in a manner that will be apparent to those skilled in the art. The doping level in region 28 is preferably selected in accordance with lateral charge control (LCC) technology, also known as REduced SURface Field (RESURF) technology, which is known in the art. Briefly, LCC technology involves maintaining at a substantially constant level the mathematical product of the thickness of region 28 and the aggregate doping level of such region, in terms of dopant atoms per square centimeter. Doping of a voltage-supporting region, such as region 28, in accordance with LCC technology, achieves a substantially uniform electric field across the surface of the respective voltage-supporting region, while minimizing the device area occupied by such region.

As mentioned above, accurate control of net dopant dosage of region 28 can be achieved by use of the two-step doping procedure described thus far. The two-step doping procedure does not achieve doping uniformity throughout the vertical extent of region 28, however. Beneficially, LCC technology is insensitive to non-uniform doping, being dependent instead on net dopant dosage (i.e., dosage per square centimeter of device area as viewed from above in FIG. 1).

It is not necessary that the entire vertical extent of semiconductor layer 24 be converted to P-conductivity type. The lower portion, for example, may remain N-conductivity type, so long as the net dopant dosage of such N-conductivity type lower portion is only a small fraction (i.e., less than about one-quarter) of the net dopant dosage of the overlying P-conductivity type portion, and the above criteria relative to voltage-supporting capability and depletability of region 28 apply.

To achieve high current conduction in semiconductor devices 12 and 14 (FIG. 1), semiconductor layers 22 and 24 must be thick (e.g., greater than about 5 microns in the vertical direction in FIG. 1). An increase in the thickness of layers 22 and 24 is particularly effective to raise current conduction capacity in bipolar devices, such as insulated-gate transistors (IGTs) or bipolar transistors.

The doping of high-thickness semiconductor layers 22 and 24, where they comprise silicon, poses special problems. With semiconductor layers 22 and 24 each exceeding about 5 microns in thickness, the epitaxial silicon grown in insulating tubs 18 and 22 is preferably of N-conductivity type. The P-conductivity dopant then used in the FIG. 3 doping step preferably comprises a fast-diffusing dopant, such as aluminum, gallium, or boron. If it is desired that silicon layer 24 be converted to P-conductivity type throughout its entire vertical extent, the maximum thickness of silicon layer 24 is limited by the maximum diffusion depth of P-conductivity type dopant introduced into the silicon layer for the diffusion temperature used.

If silicon layers 22 and 24 are less than about 5 microns in thickness, a slower-diffusing P-conductivity type dopant may be used in the FIG. 3 doping step, such as boron.

Figure 4:
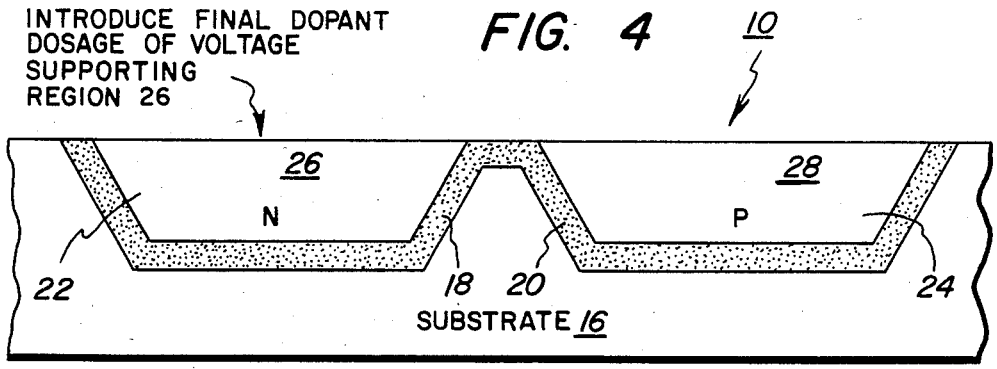

As next illustrated in FIG. 4, a final dopant introduction is made into semiconductor layer 22. This is accomplished by introducing N-conductivity type dopant, such as phosphorous, into layer 22 in an amount that achieves a final net dopant dosage in voltage-supporting region 26. A suitable, final dopant concentration for voltage-supporting region 26 is one fulfilling the criteria set forth above for final doping of voltage-supporting region 28.

Ion implantation is preferably employed in the dopant introduction step of FIG. 4 to assure accurate control of net dopant dosage. Since the final, highly accurate net dopant dosage of voltage-supporting region 26 is much higher than the initial doping (i.e., less-than-20-percent-of-final-dosage), the net dosage level in voltage-supporting 26 is controllable to a highly accurate degree, despite the fact that it is difficult to control the net dopant dosage during the initial epitaxial growth of semiconductor layer 22.

To complete the fabrication of MOSFETs 12 and 14 of FIG. 1 in regard to their various semiconductor regions, associated electrodes, and insulating layers, conventional field-effect transistor (FET) technology may be utilized. Formation of one or more of the various semiconductor regions of MOSFETs 12 and 14 may precede or succeed either of the FIGS. 3 and 4 doping steps.

In a specific example of fabricating an IC 10 with MOSFETs 12 and 14, layers 22 and 24 comprise silicon of 10-micron thickness, with a dopant concentration per unit volume of silicon epitaxially grown as depicted in FIG. 2 of about $2 \times 10^{14}$ dopant atoms per cubic centimeter. The FIG. 3 final dopant introduction in voltage-supporting region 28 is then selected to yield a net charge per square centimeter of about $10^{12}$. Similarly, the FIG. 4 introduction in voltage-supporting region 26 is selected to yield a net final dopant charge per square centimeter of about $10^{12}$.

Figure 5A:
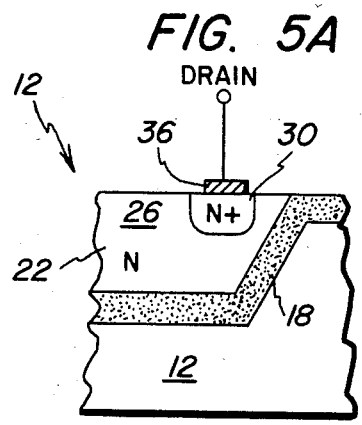
FIG. 5A is a detail view of MOSFET 12 of FIG. 1
Figure 5B:
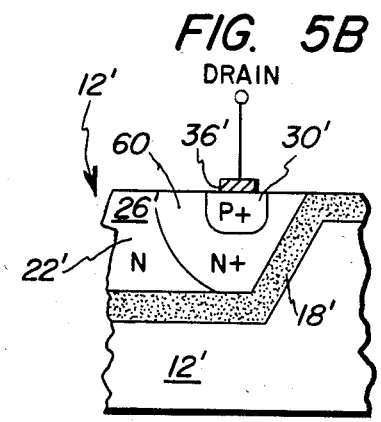
FIG. 5B is a detail view of an alternative structure to fabricate an insulated-gate transistor.

An insulated-gate transistor (IGT) 12' may be fabricated by following the foregoing example and making the substitutional changes in device 12 (FIG. 1) as depicted in the alternative detail views of FIGS. 5A and 5B. In particular, a P+ region 30' (FIG. 5B) is substituted for N+ drain region 30 (FIG. 5A) and an N+ region 60 (FIG. 5B) is interposed between P+ region 30' and voltage-supporting region 26', and has a net dopant dosage of about $10^{13}$ per square centimeter. Region 26' of IGT 12' (FIG. 5B) has a lower net dopant dosage, of $10^{12}$ per square centimeter. N+ region 60 (FIG. 5B) prevents P+ region 30' from injecting current carriers (holes, here) into voltage-supporting region 26' during forward blocking. Further details of IGTs may be found, for example, in an article by B.J. Baliga et al., entitled, "The Insulated-Gate Rectifier (IGR): A New Power Switching Device", IEDM 82 (December 1982), pages 264-267, which is incorporated herein by reference.

Figure 6:
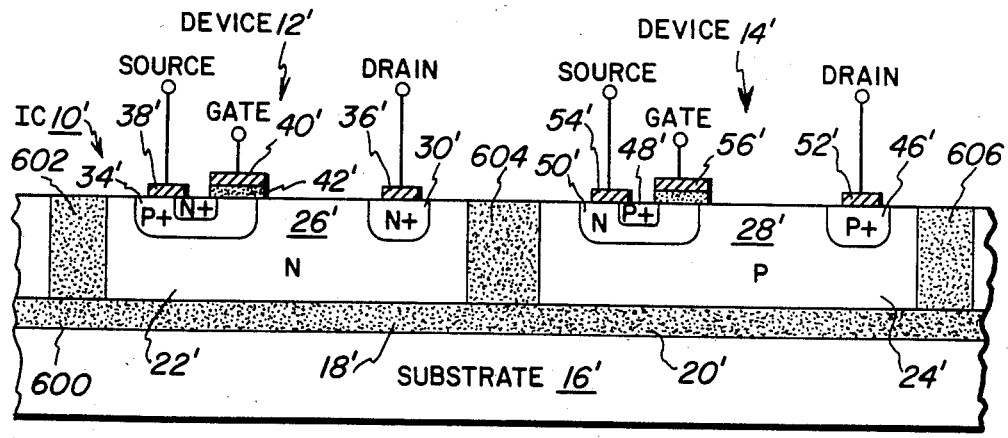
FIG. 6 is a view similar to FIG. 1, illustrating an alternative form of integrated circuit that may be formed by the method of the present invention.

The method of the present invention is applicable to the formation of integrated circuits with high voltage semiconductor devices comprising dielectric isolation (DI) devices, in addition to silicon-on-insulator (SOI) devices, as described above. For example, the integrated circuit (IC) 10', illustrated in FIG. 6, includes DI devices 12' and 14' and may be formed by the present method.

Fabrication of IC 10' is essentially similar to the fabrication of IC 10 (FIG. 1), except for one primary difference (discussed below). The various parts of devices 12' and 14' of IC 10', accordingly, have reference numerals similar to the reference numerals for the corresponding parts of IC 10.

IC 10' differs from IC 10 in regard to the configuration and fabrication of substrate 16 and insulating tubs 18' and 20' of IC 10'. In particular, insulating layer 600, oriented laterally as viewed in FIG. 6 and typically of silicon dioxide, is formed prior to insulating layers 602, 604, and 606, which are oriented vertically as viewed in FIG. 6. Moreover, vertically-oriented insulating layers 602, 604, and 606 are typically formed after semiconductor layers 22' and 24' have been epitaxially grown. In contrast, insulating tubs 18 and 20 of IC 10 are formed in a single fabrication step and prior to the epitaxial growth of semiconductor layers 22 and 24.

The fabrication of insulating tubs 26' and 28' in IC 10' may be carried out using conventional techniques, one of which is discussed, for example, in an article by A.C. Ipri, "The Properties of Silicon-On-Sapphire Substrates, Devices and Integrated Circuits", contained in D. Kahng, Editor, *Applied Solid State Science, Supplement 2, Silicon Integrated Circuits, Part A*, New York: Academic Press (1981), pages 263-295, the entirety of the this article being incorporated herein by reference.

The foregoing describes a method of fabricating an integrated circuit (IC) with complementary, high voltage semiconductor devices dielectrically-isolated from each other as well as from an IC substrate. The method may utilize existing semiconductor device fabrication technology and produces complementary semiconductor devices with high voltage and high current capabilities.

While the invention has been described with respect to specific embodiments, many modifications and substitutions will occur to those skilled in the art. It is, therefore, to be understood that the appended claims are intended to cover all such modifications and substitutions as fall within the true spirit and scope of the invention.

What is claimed as the invention and desired to be secured by Letters Patent of the United States is:

1. A method of fabricating an integrated circuit including first and second, dielectrically-isolated complementary, high voltage semiconductor devices, the first semiconductor device including a first voltage-supporting region of one conductivity type and the second device including a second voltage-supporting region of opposite conductivity type, said first and second voltage-supporting regions being of the lateral-current conduction type, the method comprising the steps of:
    (a) providing a semiconductor wafer including partially-formed first and second insulating tubs in which said first and second semiconductor devices are to be respectively formed;
    (b) epitaxially growing in said first and second insulating tubs, respectively, first and second semiconductor layers, respectively, said epitaxially-grown layers being doped to the one conductivity type with a doping concentration below 20 percent of the final doping concentration of said first device voltage-supporting region;
    (c) introducing the opposite conductivity type dopant into said second layer to complete the doping of said second voltage-supporting region, said dopant being limited in amount such that said second voltage-supporting region is entirely depletable at a rated blocking voltage of the second semiconductor device;
    (d) introducing the one conductivity type dopant into said first layer to complete the doping of said first voltage-supporting region, said dopant being limited to such an extent that the first voltage-supporting region is entirely depletable at a rated blocking voltage of said first semiconductor device;
    (e) forming respective main current semiconductor regions in said first and second layers; and
    (g) forming main current electrodes on said main current semiconductor regions.

2. The fabrication method of claim 1 wherein each of the steps of introducing dopant into said first and second layers, to complete the doping of said first and second voltage-supporting regions, comprises ion implantation.

3. The fabrication method of claim 2 wherein said first and second layers comprise silicon.

4. The fabrication method of claim 3 wherein said first and second layers are each in excess of about 5 microns in thickness.

5. The fabrication method of claim 4 wherein the opposite conductivity type dopant introduced into said second semiconductor layer comprises aluminum, gallium, or boron.

* * * * *